United States Patent [19]
Ghoshal

[11] Patent Number: 6,161,388
[45] Date of Patent: Dec. 19, 2000

[54] ENHANCED DUTY CYCLE DESIGN FOR MICRO THERMOELECTROMECHANICAL COOLERS

[75] Inventor: Uttam Shyamalindu Ghoshal, Austin, Tex.

[73] Assignee: International Business Machines Corporation, Armonk, N.Y.

[21] Appl. No.: 09/222,245

[22] Filed: Dec. 28, 1998

[51] Int. Cl.[7] ............................................. F25B 21/02
[52] U.S. Cl. ............................................................ 62/3.7
[58] Field of Search ................................................. 62/3.7

[56] References Cited

U.S. PATENT DOCUMENTS

| | | | |
|---|---|---|---|
| 5,470,395 | 11/1995 | Yater et al. | 136/203 |
| 5,515,682 | 5/1996 | Nagakubo et al. | 62/3.7 |
| 5,609,032 | 3/1997 | Bielinski | 62/3.7 |
| 5,650,904 | 7/1997 | Gilley et al. | 361/56 |
| 5,867,990 | 2/1999 | Ghoshal | 62/3.7 |
| 5,881,560 | 3/1999 | Bielinski | 62/3.2 |
| 5,917,226 | 6/1999 | Chan et al. | 257/415 |
| 5,921,087 | 7/1999 | Bhatia et al. | 62/3.2 |
| 5,966,941 | 10/1999 | Ghoshal | 62/3.7 |

FOREIGN PATENT DOCUMENTS

WO 00/08693  2/2000  WIPO .

*Primary Examiner*—Henry Bennett
*Assistant Examiner*—Mark Shulman
*Attorney, Agent, or Firm*—Casimer K. Salys; Felsman, Bradley, Vaden, Gunter & Dillon, LLP

[57] ABSTRACT

A thermoelectric cooling apparatus which includes a Peltier device or a thermoelectric element coupled to a hot source and a cold sink. The hot source dissipates heat produced by the thermoelectric element. The cold sink is coupled to a mass to be cooled. A means for supplying power to the thermoelectric element is provided and a means for selectively thermally coupling the thermoelectric element to the hot source is provided. Selectively thermally switching the thermoelectric element to the hot source allows heat to be dissipated to the hot source when the thermoelectric element possesses excess heat. Dissipating the excess heat when the excess heat is present allows higher efficiencies to be attained in thermoelectric cooling.

15 Claims, 2 Drawing Sheets

ENHANCED DUTY CYCLE DESIGN FOR MICRO THERMOELECTROMECHANICAL COOLERS

CROSS REFERENCE TO RELATED APPLICATIONS

The present application is related to copending U.S. patent application Ser. No. 08/988,429 U.S. Pat. No. 5,867,990 (Docket No. AT9-97-710) filed on Dec. 10, 1997, titled "Thermoelectric Cooling With Dynamic Switching to Isolate Heat Mechanisms" and U.S. patent application Ser. No. 08/988,621 U.S. Pat. No. 5,966,941 (Docket No. AT9-97-707) filed on Dec. 10, 1997, titled "Thermoelectric Cooling With Dynamic Switching To Isolate Heat Transport Mechanisms". The abovementioned patent applications are assigned to the assignee of the present invention. The content of the cross referenced copending applications are hereby incorporated herein by reference thereto.

BACKGROUND OF THE INVENTION

1. Technical Field

The present invention relates in general to enhancing the duty cycle of a thermoelectric cooler element, and in particular to a method and system for achieving greater efficiency from a thermoelectric cooler. Still more particularly, the present invention relates to a method and system of thermally switching a thermoelectric element such that reduced thermal resistance can be attained from a thermoelectric element to a hot source during intermittent periods within a heat transfer cycle of a thermoelectric cooling process.

2. Description of the Related Art

The utilization of thermoelectric devices in industry has, to date, been restricted to very specialized applications. Due to inefficiencies, very few applications can effectively utilize thermoelectric effects. The undesirable properties of thermoelectric elements such as high cost and low efficiency are outweighed by the desirable properties of thermoelectric devices. Recently, there have been significant advances in material technology, many attributable to advances made by the semiconductor industry.

Conventional cooling systems, such as a those found in a refrigerator, utilize vapor compression refrigeration cycles to provide heat transfer. Vapor compression cooling requires significant moving hardware, including at a minimum, a compressor, a condenser, an evaporator, and related coolant transfer plumbing. Miniature vapor compression cooling is not available for small cooling applications.

Semiconductors and superconductors have enhanced performance at lower temperatures. CMOS logic can operate materially faster at lower temperatures. For example, if CMOS logic devices are operated at −50° C., performance is improved by 50 percent over ambient room temperature. Liquid nitrogen cooling of CMOS logic to −196° C., has shown a 200 percent performance improvement in speed.

Similar benefits have been discovered for integrated circuit wiring. Wiring resistances decrease by a factor of two for integrated circuits operated at −50° C. in comparison to room ambient temperature operation.

Thus, sub-ambient temperature operation of integrated circuit logic devices, such as field effect transistors, as well as the interconnect wiring can materially improve integrated circuit performance. However, accomplishing such cooling in the confines of an ever decreasing size poses new challenges.

The dimension of integrated circuit transistors is continually decreasing and the density of transistors is ever increasing. Faster switching speeds or more switching transitions per unit time also contributes to additional heating. Currently, switching speeds of over one gigahertz are being implemented and adequate cooling has increasing importance in such devices.

Analog circuits, such as voltage controlled oscillators, phase detectors, mixers, and low noise amplifiers produce more heat than digital circuits. Additionally, lasers and photo diodes have remarkably improved performance and resolution at lower temperatures. Thus, cooling of sensors within mass data storage devices is increasingly important. Hot spots within an integrated circuit can cause a host of related failures. As the dimension of integrated circuits decrease and become more compact, the dissipation of internally generated heat becomes an increasing problem.

Thermoelectric cooling is one alternative that has found some utilization given the compact size of Peltier devices. Peltier device thermoelectric cooling is very reliable because such devices are solid state. The inefficiency of thermoelectric devices is a key negative aspect of implementing a thermoelectric cooling design. A Peltier device cooling system typically has an efficiency in the range of 20 percent for a relatively nominal temperature differential between the cold sink and ambient temperature conditions.

For example, utilizing a Peltier cooling system to cool at a rate of one watt and attain a sub-ambient temperature of 0° C. requires that the system be powered with five watts. As the amount of heat to be transferred increases, the total power to be dissipated into the environment mandates large convection devices and large power supply circuits. Therefore, Peltier device thermoelectric cooling has not been considered a broadly applicable technology for cooling electronic and optical devices.

Typically, Peltier devices are fabricated from semiconductor material such as bismuth telluride or lead telluride. Commonly utilized, Peltier materials exhibit very high electrical conductivity and relatively low thermal conductivity. In contrast, most metals have both high electrical and high thermal conductivity.

In operation, a Peltier device transports electrons from a cold sink at temperature $T_{cold}$ to a hot source at temperature $T_{hot}$ in response to an electric field placed across the Peltier device.

FIG. 1 schematically depicts a conventional Peltier type thermoelectric element (TE) 1 with DC power supply 2 creating an electric field across TE 1 and a load current 3. The desired heat transfer is from cold mass 4 at temperature $T_{cold}$ to heat exchanger 6 at temperature $T_{hot}$. The basic heat transfer of a thermoelectric element is represented below.

$$q = \alpha T_{cold} I - \tfrac{1}{2} I^2 R - K \Delta T \qquad \text{Equation 1:}$$

The net heat energy transported by a Peltier device is composed of three elements. In equation 1, the first element $\alpha T_{cold} I$ represents the Peltier effect (thermoelectric) contribution, the second element $\tfrac{1}{2} I^2 R$ defines negative Joule heating or resistive effects, and the third element $K \Delta T$ defines negative conductivity effects (back flow) of the heat. The thermoelectric component is composed of the Seebeck coefficient $\alpha$, the temperature of operation ($T_{cold}$) and the current through the TE device I.

Approximately one half of the Joule heating produced by the bias current is conducted to the cold sink and the remainder to the hot source. Lastly, the negative component attributable to thermal conduction represents the heat flow or heat conduction through the Peltier device. K is the thermal conductivity of the Peltier device from the hot source to the cold sink.

In equation 1, the thermoelectric component of the heat transport increases linearly with the current through the Peltier device and the Joule heating increases in proportion to the square of the current. Alternately described, the resistive heating exponentially increases due to the current through the Peltier device while the cooling effect linearly increases with increased current flow. The thermal conduction is also in direct proportion to the temperature differential between the hot source and the cold sink. Equation 1 clearly reflects how quickly the Peltier device becomes inefficient.

Equation 2 below defines a coefficient of performance for a Peltier device. The coefficient of performance is the ratio of the net heat energy transported at low temperature to the power consumed in the Peltier device. For a typical Peltier device made from bismuth telluride material, the coefficient of performance is less than 0.3 for a temperature differential of 30° K.

$$\eta = \frac{\text{heat transport}}{\text{power consumption}}$$

$$= \frac{\alpha T_{cold} I - 1/2 I^2 R - K \Delta T}{I^2 R + \alpha I \Delta T}$$

Equation 2

Note that the numerator of equation 2 represents the net cooling capability of the Peltier device. The denominator of equation 2 represents the total energy provided by external DC power supply 2. The individual elements of the numerator are described above in reference to equation 1. The first element in the denominator is the total Joule heating, while the second element is the heat energy transport work done by the Peltier device in moving energy from the $T_{cold}$ sink to the $T_{hot}$ source. Based upon this relationship, the maximum coefficient of performance possible in the configuration of FIG. 1 is given by equation 3.

$$\eta_{max} = \frac{T_{cold}}{\Delta T} \gamma - \frac{\frac{T_{hot}}{T_{cold}}}{\gamma + 1}$$

Equation 3

The parameter γ can be expressed in terms of the Seebeck coefficient α, electrical conductivity σ and thermal conductivity λ as set forth in equation 4.

$$\gamma = 1 + \frac{\gamma^2}{RK} T_{hot} + \frac{T_{cold}}{2} = 1 + \frac{\alpha^2 \sigma}{\lambda} \overline{T} = 1 + Z\overline{T}$$

Equation 4

The first factor in equation 3 $T_{cold}/\Delta T$ is the maximum efficiency possible for any heat pump operating between two thermal sinks $T_{cold}$ and $T_{hot}$. $T_{cold}/\Delta T$ is commonly referred to as the Carnot efficiency. The second factor represents the non-ideal thermoelectric cooling, which can also be characterized by a figure of merit $Z\overline{T}$. Note that $\eta \rightarrow (T_{cold}/\Delta T)$ as $\gamma \sqrt[3]{\infty}$. To date it has been very difficult to develop a thermoelectric material which yields high values of $Z\overline{T}$.

Historically, the prevalent material for thermoelectric coolers has been bismuth telluride ($Bi_2Te_3$) and lead tellurium (PbTe). These materials have $Z\overline{T}$ values of approximately 0.3 at room temperature. Recent research has shown that $Z\overline{T}$ values approaching one may be possible in lead tellurium quantum wells and multi-lattices. However, even with these materials, thermoelectric devices have not produced practical cooling solutions.

Another constraint of Peltier device cooling is that only a limited temperature excursion below ambient temperature is attainable. The temperature differential limitation arises from the fact that the effective temperature differential is constrained by efficiency. Efficiency degrades quickly with an increasing temperature differential between a hot source and a cold sink. The maximum temperature differential possible $T_{max}$ is given by equation 5 below.

$$\Delta T_{max} = \frac{1}{2} Z T^2_{cold}$$

Equation 5

For bismuth telluride having a $Z\overline{T}$ of approximately 0.3, $T_{max}$ is 45° K. at 300° K., where 32° F. is equivalent to 273° K.

Thus, there are a number of very fundamental constraints on efficiency and differential temperature that limit the practical utilization of conventional thermoelectric elements for cooling applications. Particularly, applications which utilize ambient temperatures to dissipate the heat are impracticable. Typically, each Peltier device is small in dimension and can only transport a finite amount of heat. Therefore, to produce a cooling effect of desired magnitude many Peltier devices must be connected together.

Enhancement to basic thermoelectric cooling designs can be achieved by switching the thermoelectric elements. Peltier cooling is fast (sub-microsecond) while thermal conduction is slower (millisecond). The difference in temporal scales can result in enhanced cooling under transient conditions. Thermal and electrical switching can be accomplished by microelectromechanical switches and by tunnel junction heat switches. Switched coolers increase the efficiency of Peltier devices and permit maximum temperature differentials as large as 200° K.

It should therefore be apparent that there is a need for method and system for selectively powering and selectively thermally switching thermoelectric devices to enhance the efficiency of a thermoelectric cooler.

SUMMARY OF THE INVENTION

It is therefore one object of the present invention to provide an enhanced duty cycle for a thermoelectric cooler element.

It is another object of the present invention to provide a thermoelectric cooler system having higher efficiency.

It is yet another object of the present invention to provide a method and system for thermally switching a thermoelectric element to attain a reduced thermal resistance from a thermoelectric element to a hot source during critical portions of a cooling cycle.

The foregoing objects are achieved as is now described. A thermoelectric cooling apparatus which includes a Peltier device or a thermoelectric element coupled to a hot source and a cold sink. The hot source dissipates heat produced by the thermoelectric element. The cold sink is coupled to a mass to be cooled. A means for supplying power to the thermoelectric element is provided and a means for selectively thermally coupling the thermoelectric element to the hot source is provided. Selectively thermally switching the thermoelectric element to the hot source allows heat to be dissipated to the hot source when the thermoelectric element possesses excess heat. Dissipating the excess heat when the excess heat is present allows higher efficiencies to be attained in thermoelectric cooling.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 2:
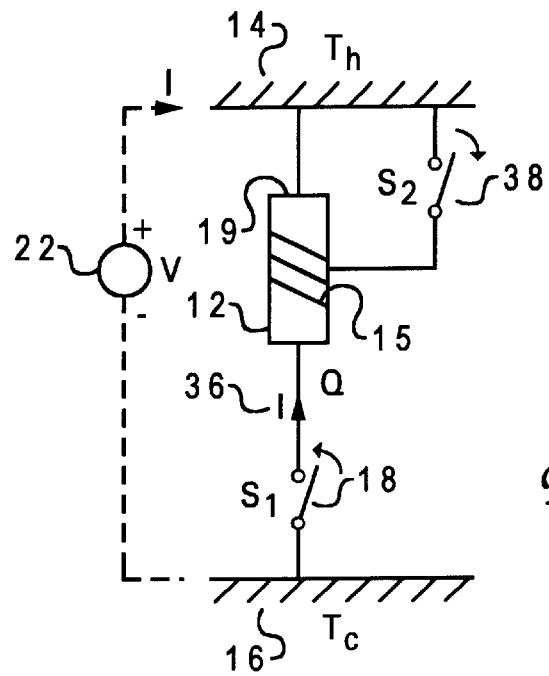
FIG. 2 is a schematic of a thermoelectric cooling system having enhanced thermal switching in accordance with the present invention.

With reference now to the figures and in particular with reference to FIG. 2, there is depicted a novel interconnection of Peltier device to a hot source 14 and a cold sink 16 in accordance with one embodiment of the present invention. During operation, Peltier device 15 heats hot source 14 and cools cold sink 16. FIG. 2 illustrates a simplified schematic depicting a peltier device which is coupled to cold sink 16 via first thermoelectric switch 18.

First thermoelectric switch 18 thermally couples cold sink 16 to Peltier device 15. Second thermal switch 38 couples hot source 14 to Peltier device 15. Thus, Peltier device 15 is electrically and thermally coupled to cold sink 16 when first thermoelectric switch 18 is in the closed position. In the illustrated embodiment, Peltier device 15 is continuously thermally and electrically coupled to hot source 14 at first end 19 of Peltier device 15 through a thermal path having little thermal resistance.

Second end 17 of Peltier device 15 is thermally coupled to cold sink 16 when first thermoelectric switch 18 is in the closed position. As embodied in FIG. 2, power source 22 provides a controlled current to Peltier device 15. The resistance of Peltier device 15 is low and a few millivolts across Peltier device 15 produces a current through Peltier device 15 on the order of one ampere. In a preferred embodiment, a current pulse 36 is supplied by power source 22 to Peltier device 15.

Figure 3:
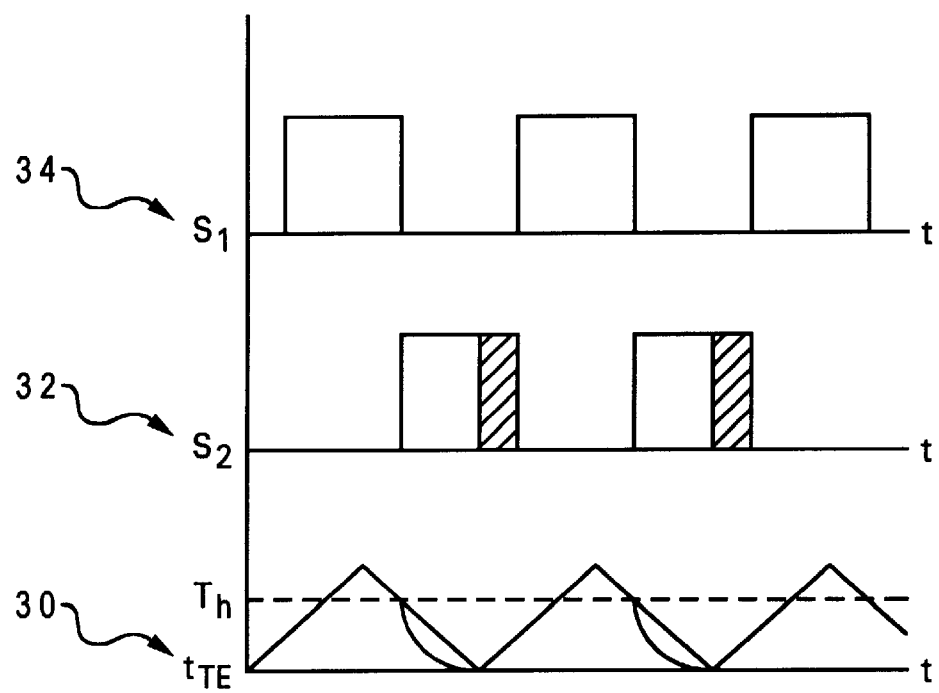
FIG. 3 is a graph of switch operation as a function of time in accordance with an embodiment of the thermoelectric cooler in FIG. 2.

Referring now to FIG. 3, a graph relating time to switch positions and temperature divergence is illustrated. FIGS. 2 and 3 will be referred to alternately to provide an operational description of one embodiment of a thermoelectric cooler.

At the start of a cycle, the temperature of Peltier device 15 and hot source 14 are substantially similar by virtue of the thermal coupling of Peltier device 15 to hot source 14. Upon current flow through Peltier device 15 due to closure of first thermoelectric switch 18, Peltier device 15 quickly establishes a relative temperature differential between hot source 14 and cold sink 16 from the Peltier effect. Specifically, hot source 14 is heated and cold sink 16 is cooled by Peltier device 15. The temperature differential allows heat transfer from second end 17 of Peltier device 15 to cold sink 16.

The temperature of first end of Peltier device 15 rises above the temperature of hot source 14 and first thermoelectric switch 18 opens, interrupting the current flow and preventing further Joule heating. At a time proximate to opening of first thermoelectric switch 18, second thermal switch 38 closes to expedite the thermal conduction of Joule heat from Peltier device 15 to hot source 14.

More particularly, approximately three milliseconds after the leading edge of a current pulse 36 is supplied to Peltier device 15, Joule heating effects, due to resistance within Peltier device 15, elevate the average temperature of Peltier device 15 such that the net Peltier heat transfer through Peltier device 15 due to the Peltier effect begins to decrease. At the trailing edge of the current pulse 36, first thermoelectric switch 18 is opened, disconnecting the thermal path from Peltier device 15 to cold sink 16.

The location of second thermoelectric switch 38 on Peltier device 15 is not relevant to the scope of the present invention and coupling second thermal switch 38 to any location on Peltier device 15 would provide cooling enhancements in accordance with the present invention.

The residual thermal energy in Peltier device 15 due to Joule heating decays to hot source 14. An accelerated exponential decay is achieved through second thermal switch 38 due to the decreased thermal resistance which second thermal switch 38 provides from Peltier device to hot source 14. When the temperature of Peltier device 15 has decayed to a temperature approaching hot source 14, the cycle is repeated.

It is preferred that Peltier device 15 has a relatively high thermal impedance. A high thermal impedance is important because during the cooling cycle Peltier device 15 must provide a maximum thermal differential between hot source 14 and cold sink 16. High thermal impedance is also important for the passive portion of the cycle where thermal equilibrium is desired. Second thermal switch 38 enhances the process of thermal equilibrium and enhanced duty cycle results in enhanced efficiency.

The transient character of the heat transfer operation acknowledges that thermoelectric heat transfer occurs immediately upon the receipt of a relative voltage whereas Joule heating and subsequent thermoelectric element conduction loss are delayed effects. Thus, the invention relies on the different time scales and time constants of Peltier cooling, resistance heating and thermal conduction.

The ability to control the current pulse 36 and duty cycle of first thermoelectric switch 18 and second thermal switch 38 provides flexibility in defining switching synchronization of the present invention. Although current pulse 36 and the operation of first thermoelectric switch 18 and second thermal switch 38 both have very short duty cycles and exhibit relatively synchronous operation to one another, the pulse width and the timing of the closure and opening cycles are likely to differ depending on the transient characteristics of the thermoelectric elements utilized and the integrity of the thermal conduction from Peltier device 15 to hot source 14 and cold sink 16.

Summarizing FIGS. 2 and 3 a current pulse 36 creates instantaneous cooling due to the Peltier effect. The Peltier effect creates heat transfer from cold sink 16 to hot source 14 through closed first thermoelectric switch 18. However, before the transfer of heat from Joule heating in the opposite direction of the Peltier effect, first thermoelectric switch 18 is opened to prohibit such an undesirable transfer and second thermal switch 38 is closed to promote heat transfer to hot source 14. Specifically, first thermoelectric switch 18 opens such that the energy from Joule heating is not allowed to transfer from Peltier device 15 to cold sink 16.

A basic concept for improving efficiency from prior art designs, is herein described. With reference to Peltier device 15 in FIG. 2, a more detail description and variations thereof are more thoroughly described in the co-pending applications referenced in the first paragraph of this application. The description of FIG. 2 should not be considered as limiting the scope of the present invention as many configuration could be utilized in conjunction with the present invention.

Figure 1:
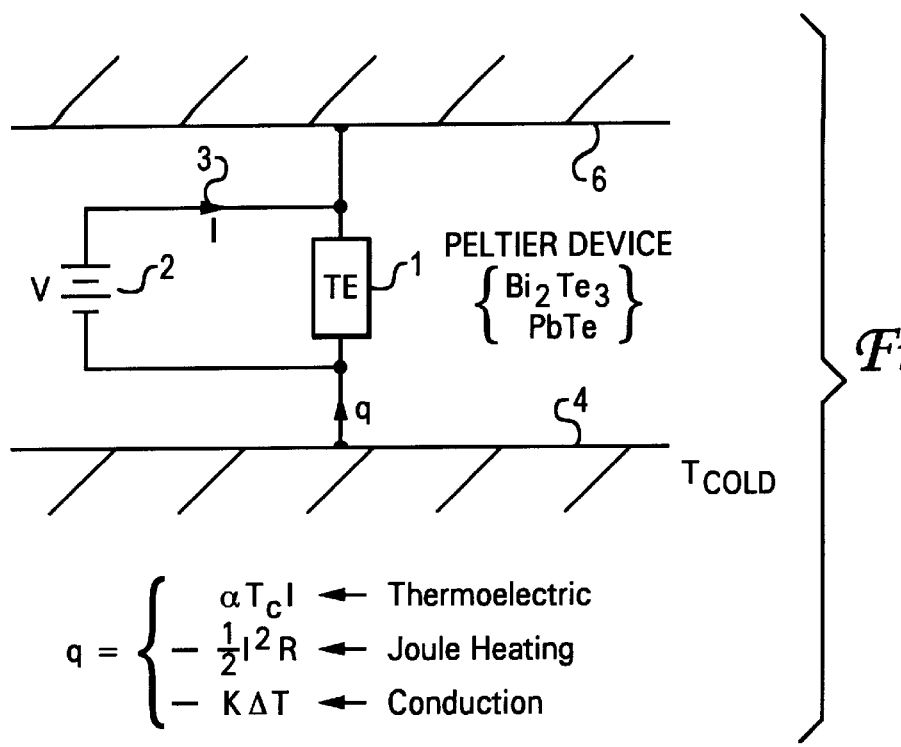
FIG. 1 is a schematic of a conventional statically operable Peltier cooling system.
Figure 4:
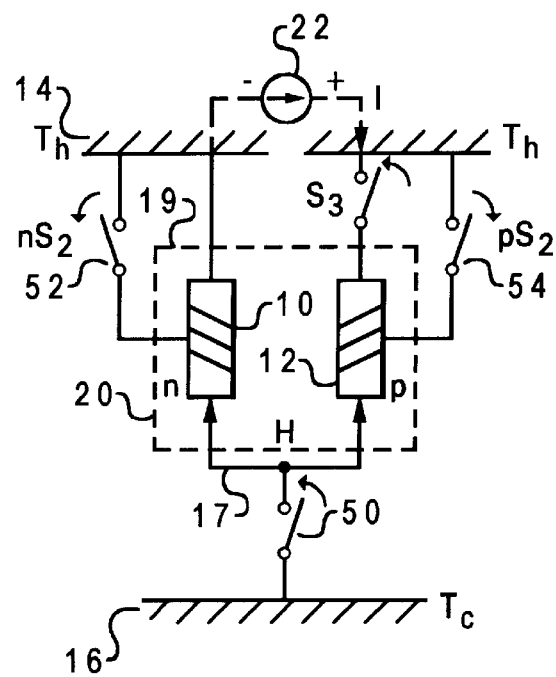
FIG. 4 is a schematic of a dual thermoelectric cooling system having enhanced thermal switching in accordance with the present invention.

Referring now to FIG. 4, a dual Peltier device thermoelectric cooling configuration is depicted. Thermoelectric device 20 is comprised of N-type thermoelectric element 10 and P-type thermoelectric element 12. The system illustrated in FIG. 4 is similar to the configuration depicted in FIG. 2, however, two Peltier devices are illustrated wherein each Peltier device has a thermal switch to expedite heat transfer to hot source 14.

N-type thermoelectric element 10 and P-type thermoelectric element 12 are interconnected in a series configuration with power source 22. The direction of heat flow is dependant on the type of doping (i.e. N or P) and the direction of current flow. Thus, a serpentine configuration of N-type and P-type devices allows a series electrical interconnection and a parallel thermal interconnection.

In FIG. 4, no electrical switching is illustrated and third thermal switch 50, fourth thermal switch 52, and fifth thermal switch 54 perform thermal switching, but do not perform electrical switching nor do third thermal switch 50, fourth thermal switch 52, and fifth thermal switch 54 conduct an appreciable electrical current.

Fourth and fifth thermal switches 52 and 54 open and close concurrently such that the heat from Joule heating can be dissipated from a maximum surface area of N-type thermoelectric element 10 and P-type thermoelectric element 12 to hot source 14. Maximizing surface area which has little thermal impedance increases the efficiency of a thermoelectric element. However, continuous thermal coupling is provided from thermoelectric element 20 to hot source 14 by a low thermal impedance path via first end 19 of thermoelectric element 20.

Thermoelectric element 20 cools cold source 16 when third thermal switch 50 is closed due to the low impedance thermal path between thermoelectric element 20 and cold source 16 via second end of thermoelectric element 20 when thermoelectric element 20 is conducting current and the thermoelectric system is in the cooling portion of the cycle.

Thermal switching can be accomplished by microelectromechanical systems or by a solid state thermal switch. A microelectromechanical system can be fabricated utilizing integrated circuit techniques so as to form on a surface of a silicon chip an array of nickel magnets which can be displaced by an electrical current. A microelectromechanical switch can provide a relatively high thermal impedance in the open position and a relatively low thermal impedance in the closed position. A more detailed description is provided in the above referenced patent applications.

While the invention has been particularly shown and described with reference to a preferred embodiment, it will be understood by those skilled in the art that various changes in form and detail may be made therein without departing from the spirit and scope of the invention.

What is claimed is:

1. A thermoelectric cooling apparatus, comprising:

a hot source;

a cold sink;

a thermoelectric element coupled between said hot source and said cold sink by first and second couplings, respectively; and means for selectively thermally coupling said thermoelectric element to said hot source by a third coupling to selectively control a thermal impedance from said thermoelectric element to said hot source such that high efficiency cooling can be attained.

2. The thermoelectric cooling apparatus of claim 1, wherein said means for selectively thermally coupling said thermoelectric element to said hot source is a microelectromechanical switch.

3. The thermoelectric cooling apparatus of claim 1, wherein said means for selectively thermally coupling said thermoelectric element to said hot source is a solid-state thermal switch.

4. The thermoelectric cooling apparatus of claim 1, further comprising means for supplying power to said thermoelectric element and wherein said means for selectively thermally coupling said thermoelectric element and said means for supplying power are operable in functional synchronism.

5. The thermoelectric cooling apparatus of claim 1, wherein said thermoelectric element is selectively thermally coupled to said hot source when said means for supplying power to said thermoelectric element is inactive.

6. The thermoelectric cooling apparatus of claim 1, wherein said first coupling comprises a continuous thermal path from said thermoelectric element and said hot source.

7. The thermoelectric cooler of claim 1, wherein said thermoelectric element further includes a first surface area, a second surface area and a third surface area.

8. The thermoelectric cooler of claim 1, wherein said thermoelectric element first surface area is intermittently coupled to said cold sink.

9. The thermoelectric cooler of claim 1, wherein said thermoelectric element second surface element is continuously coupled to said hot source.

10. The thermoelectric cooler of claim 1, wherein said thermoelectric element third surface is intermittently thermally coupled to said hot source.

11. The thermoelectric cooler of claim 1, further including a continuous thermal path from said thermoelectric element and said hot source.

12. A method of controlling a thermal impedance of a thermoelectric element coupled to a cold sink and a hot source to achieve high efficiencies, said thermoelectric element having a first, second and third surface areas, said method comprising the steps of:

selectively coupling a first surface area of a thermoelectric element to a cold sink;

continuously coupling a second surface area of said thermoelectric element to a hot source; and selectively coupling a third surface area of said thermoelectric element to said hot source.

13. The method of controlling a thermoelectric cooler of claim 12, wherein said selectively coupling of said first surface area and said third surface area are functionally synchronized.

14. The method of controlling a thermoelectric cooler of claim 12, wherein said first surface area is selectively coupled to said cold sink when power is applied to said thermoelectric element.

15. The method of controlling a thermoelectric cooler of claim 12, wherein said third surface area is selectively coupled when power is not applied to said thermoelectric element.

* * * * *